(12) United States Patent
Uchida et al.

(10) Patent No.: US 9,059,566 B2
(45) Date of Patent: Jun. 16, 2015

(54) SURFACE EMITTING LASER

(71) Applicant: CANON KABUSHIKI KAISHA, Tokyo (JP)

(72) Inventors: Tatsuro Uchida, Machida (JP); Yasuhisa Inao, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/750,141

(22) Filed: Jan. 25, 2013

(65) Prior Publication Data
US 2013/0195135 A1 Aug. 1, 2013

(30) Foreign Application Priority Data

Jan. 30, 2012 (JP) ................... 2012-017092

(51) Int. Cl.
*H01S 5/183* (2006.01)
*H01S 5/042* (2006.01)
*H01S 5/18* (2006.01)
*B82Y 20/00* (2011.01)
G03G 15/04 (2006.01)
H01S 5/32 (2006.01)
H01S 5/343 (2006.01)
H01S 5/20 (2006.01)

(52) U.S. Cl.
CPC .............. *H01S 5/18* (2013.01); *H01S 5/18311* (2013.01); *H01S 5/18391* (2013.01); *B82Y 20/00* (2013.01); *G03G 15/04072* (2013.01); *H01S 5/18338* (2013.01); *H01S 5/3202* (2013.01); *H01S 5/34326* (2013.01); *H01S 5/209* (2013.01); *H01S 2301/166* (2013.01)

(58) Field of Classification Search
CPC ....... H01S 5/18; H01S 5/183; H01S 5/18338; H01S 5/18391; H01S 5/18311; H01S 5/3202; H01S 2301/166
USPC ............................ 372/46.013, 49.01, 50.124
See application file for complete search history.

(56) References Cited

U.S. PATENT DOCUMENTS

2001/0050934 A1* 12/2001 Choquette et al. ............. 372/43
2011/0261850 A1* 10/2011 Shouji et al. ............... 372/45.01

FOREIGN PATENT DOCUMENTS

JP 2001-284722 A 10/2001

* cited by examiner

*Primary Examiner* — Yuanda Zhang
*Assistant Examiner* — Michael Carter
(74) *Attorney, Agent, or Firm* — Canon USA, Inc. IP Division

(57) ABSTRACT

A surface emitting laser having a mesa structure includes an off-orientation substrate, a bottom reflection mirror, an active layer, a current confinement layer, a top reflection mirror, and a surface-relief structure. The central axis of a high-reflectivity region of the surface-relief structure and the central axis of the mesa structure do not coincide with each other.

20 Claims, 16 Drawing Sheets

SURFACE EMITTING LASER

BACKGROUND OF THE INVENTION

1. Field of the Invention

The present invention relates to a surface emitting laser.

2. Description of the Related Art

A vertical cavity surface emitting laser (VCSEL) is a known type of surface emitting laser.

The VCSEL includes an active region interposed between two reflectors and forms a resonator in a direction perpendicular to a substrate, thereby emitting light in a direction perpendicular to the substrate.

In surface emitting lasers, the control of transverse mode oscillation is an important issue. Considering the application of a surface emitting laser in electrophotography, telecommunication, or the like, it is desirable that the surface emitting laser operate in the single transverse mode.

To this end, a current confinement layer is formed inside the element of the surface emitting laser by selective oxidation. The current confinement layer limits a light-emitting region of an active layer and functions as a waveguide structure. Thereby, a single transverse mode operation is realized.

In the case where the single transverse mode operation of the surface emitting laser is attempted only by providing the current confinement layer, the diameter of the narrowed portion needs to be reduced. However, the small diameter of the narrowed portion results in a small light-emitting region, which makes it difficult to obtain a large laser output.

For this reason, to date, a method in which a power loss between the fundamental transverse mode and a high-order transverse mode is purposely introduced has been studied. That is, a method for obtaining a single transverse mode oscillation while maintaining a fairly large light-emitting region has been studied more than a method in which the single transverse mode operation is realized only by forming the current confinement layer.

As one of those methods, Japanese Patent Laid-Open No. 2001-284722 proposes a surface emitting laser that includes a stepped structure in order to provide a difference in reflectivities between a central region and the neighboring region including the central region of a light-emitting region. Japanese Patent Laid-Open No. 2001-284722 discloses a method for suppressing high-order transverse mode oscillation without reducing light output in the fundamental transverse mode by forming such a stepped structure and controlling the reflectivity of the neighboring region to be relatively lower than that of the central region.

Hereinafter, such a stepped structure is referred to as a surface-relief structure. It is desired that a lasing threshold current be further reduced in the surface emitting laser disclosed in Japanese Patent Laid-Open No. 2001-284722. Accordingly, the present invention provides a surface emitting laser in which an increase in the lasing threshold current can be suppressed.

SUMMARY OF THE INVENTION

The present invention provides a surface emitting laser that has a mesa structure. The surface emitting laser includes an off-orientation substrate, a bottom reflection mirror formed on the off-orientation substrate, an active layer formed on the bottom reflection mirror, a current confinement layer that is formed on the active layer and includes an oxidized region and a non-oxidized region, a top reflection mirror formed on the current confinement layer, and a surface-relief structure that is formed on a light-emitting region of the top reflection mirror and has a stepped structure including a low-reflectivity region and a high-reflectivity region. The central axis of the high-reflectivity region of the surface-relief structure and the central axis of the mesa structure do not coincide with each other.

Further features of the present invention will become apparent from the following description of exemplary embodiments with reference to the attached drawings.

DESCRIPTION OF THE EMBODIMENTS

A visible surface emitting laser, in particular, a red surface emitting laser commonly employs a (100)-oriented GaAs substrate inclined at an angle of several degrees to less than twenty degrees in the <111>A direction by taking into consideration that an AlGaInP-based crystal that constitutes a quantum well structure that serves as an active layer has an atomic arrangement that forms a natural superlattice structure.

Figure 3:
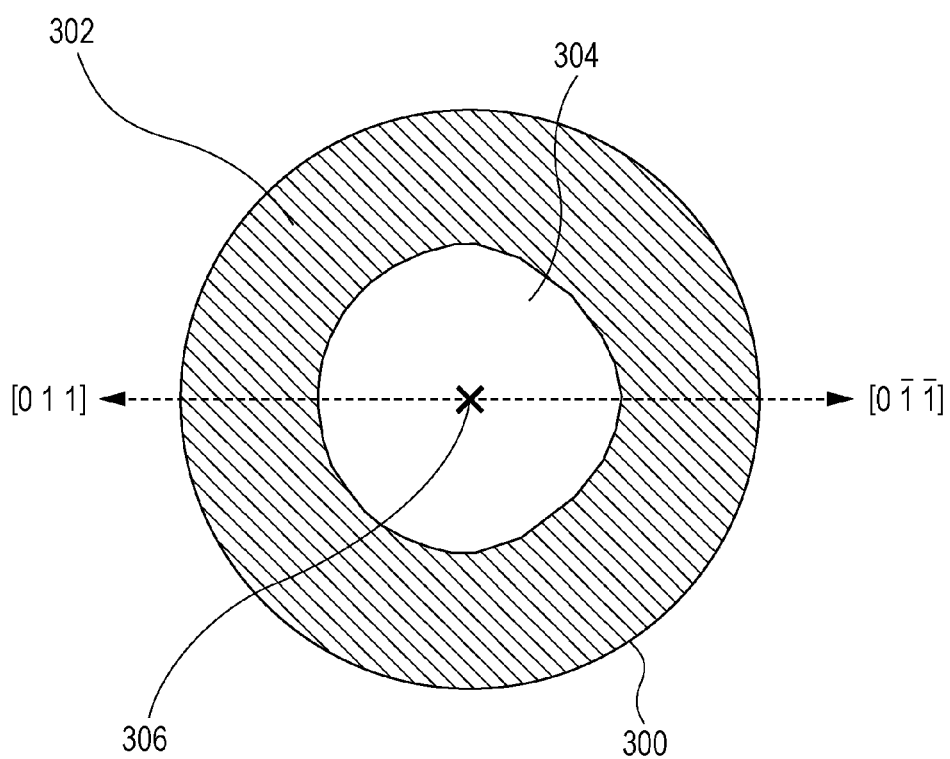
FIG. 3 is a diagram illustrating a cross-section of a current confinement layer of a surface emitting laser of Example 1.

In the case where an inclined substrate that has an off angle with respect to a specific crystal face (hereinafter, such an inclined substrate is referred to as an off-orientation substrate) is used, in a step of steam oxidation for fabricating a current confinement layer, the shape of a current injection region, which is a non-oxidized region, may be distorted due to the in-plane anisotropy of oxidation rate, and not conform to a mesa shape. For example, when a cylindrical-mesa-shaped $Al_{0.98}Ga_{0.02}As$ layer is oxidized in steam, the current injection region (non-oxidized region) 304 is formed so as to have a circular shape distorted in a specific direction as shown in FIG. 3. In such a current injection region that has a distorted circular shape, the center of the fundamental transverse mode does not coincide with the center 306 of the mesa structure. In such a case, if a surface-relief structure is formed so that the center of the mesa structure and the center of the high-reflectivity region coincide with each other, the power of the fundamental mode oscillation, which is the intended type of oscillation, is partially lost. As a result, a lasing threshold current of the fundamental mode may disadvantageously increase.

Accordingly, the present invention provides a mesa-shaped surface emitting laser that has a current confinement layer. The surface emitting laser suppresses an increase in the lasing threshold current even in the case where an off-orientation substrate and a surface-relief structure are employed.

As described above, in the case where an off-orientation substrate is used, in a step of steam oxidation after formation of the mesa structure, the shape of a current injection region (non-oxidized region) may be distorted. In this case, the center of the mesa structure does not coincide with the center of the fundamental transverse mode. Therefore, if the center of the mesa structure and the center of the high-reflectivity region of the surface-relief structure are located so as to coincide with each other, a lasing threshold current of the fundamental mode may disadvantageously increase. Accordingly, a feature of a surface emitting laser according to an embodiment of the present invention is that the center of the high-reflectivity region of the surface-relief structure is located so as to be closer to the center of the fundamental transverse mode. In order to produce such a surface emitting laser, the center of the high-reflectivity region of the surface-relief structure can be arranged in accordance with the inclination of the off-orientation substrate in consideration of the in-plane anisotropy of the steam oxidation rate. Hereafter, Examples of the present invention will be described.

EXAMPLES

Example 1

In Example 1, a surface emitting laser that includes a convex surface-relief structure formed in a light-emitting region will be described.

Figure 1:
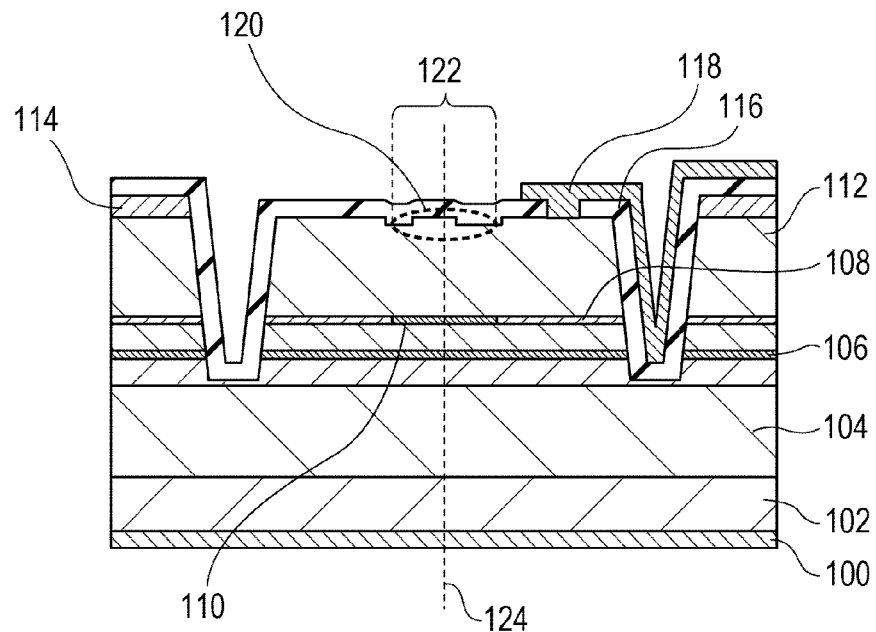
FIG. 1 is a schematic diagram illustrating a structure of a surface emitting laser of Example 1.

FIG. 1 is a schematic diagram illustrating a structure of a surface emitting laser according to an embodiment of the present invention.

FIG. 1 is a cross-sectional, schematic diagram illustrating a surface emitting laser of Example 1. A bottom reflection mirror (multilayer-film reflector) 104, an active layer 106, and a current confinement layer are formed on an off-orientation substrate 102. The current confinement layer is constituted by a current confinement region (oxidized region) 108 and a current injection region (non-oxidized region) 110. On the current confinement layer, a top reflection mirror (multilayer-film reflector) 112, a dielectric film 114, and an insulating film 116 are formed. A portion of the top reflection mirror 112 is etched to form a surface-relief structure 120. The reference numerals 122 and 124 denote a light-emitting region and a central axis of a mesa structure, respectively. In order to inject current to the surface emitting laser, an n-side electrode 100 and a p-side electrode (pad electrode) 118 are formed.

Figure 2:
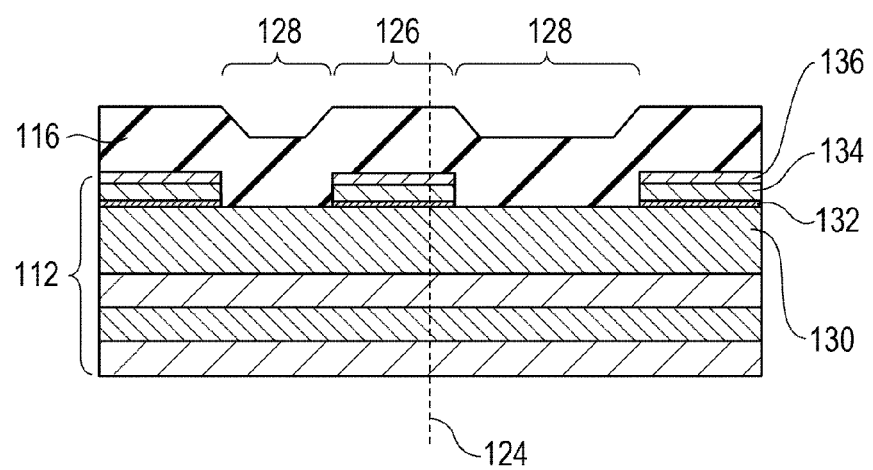
FIG. 2 is a schematic diagram illustrating a structure of a surface emitting laser of Example 1.

FIG. 2 is an enlarged view of a portion around the light-emitting region 122. As shown in FIG. 2, regarding a high-reflectivity region 126 and a low-reflectivity region 128 of the surface-relief structure, the center of the high-reflectivity region 126 does not coincide with the central axis 124 of the mesa structure. This suppresses an increase in the lasing threshold current even in the case where the off-orientation substrate 102 is used.

Now, a layer structure of the surface-relief structure will be described in detail.

The surface of the top reflection mirror 112 is constituted by a stacked structure that includes a p-type $Al_{0.5}Ga_{0.5}As$ layer 130, a p-type AlGaInP etch stop layer 132, a p-type $Al_{0.5}Ga_{0.5}As$ layer 134, and a p-type GaAs contact layer 136. In Example 1, the surface-relief structure was formed by etching a portion of each of the p-type AlGaInP etch stop layer 132, the p-type $Al_{0.5}Ga_{0.5}As$ layer 134, and the p-type GaAs contact layer 136.

In order to obtain a single transverse mode operation with the utmost efficiency, the total layer thickness of the p-type AlGaInP etch stop layer 132, the p-type $Al_{0.5}Ga_{0.5}As$ layer 134, and the p-type GaAs contact layer 136 can be equal to an odd multiple of a quarter of the wavelength in terms of optical thickness. The length equal to an odd multiple of a quarter of the wavelength in terms of optical thickness can be represented as an odd multiple of $\lambda/4n$, where $\lambda$ is the oscillation wavelength and n is the refractive index of the semiconductor layer.

In Example 1, a (100)-oriented GaAs off-orientation substrate inclined at an angle of 10 degrees in the <111>A direction was used as the off-orientation substrate 102, and an $Al_{0.98}Ga_{0.02}As$ layer was used as a layer in which a current confinement layer was formed by selective oxidation. A cylindrical mesa structure was formed by etching, and the $Al_{0.98}Ga_{0.02}As$ layer was oxidized in steam at a high temperature from the sidewall of the mesa structure to form the current confinement layer shown in FIG. 3. Specifically, because of the anisotropy of oxidation rate in the current confinement region (oxidized region) 302 due to the in-plane anisotropy of the substrate, the current injection region (non-oxidized region) 304 was not formed so as to have a regular circular shape aligned with the periphery 300 of the mesa structure, but so as to have a circular shape distorted in the <111>A direction.

Figure 4A:
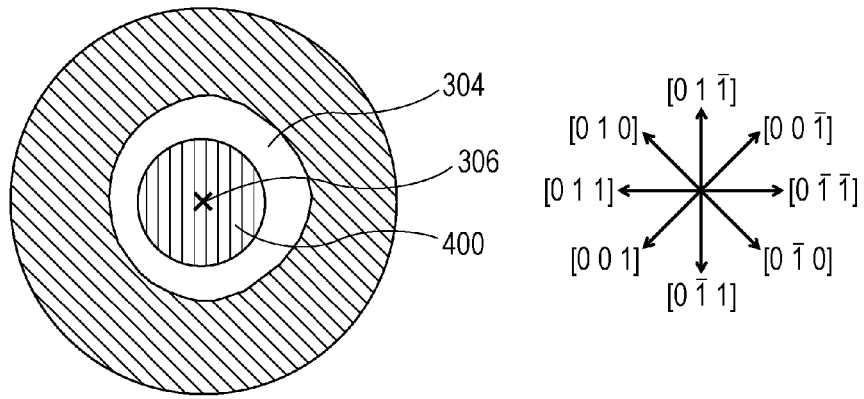
FIGS. 4A to 4C are diagrams illustrating cross-sections of a current confinement layer of a surface emitting laser of Example 1.
Figure 4B:
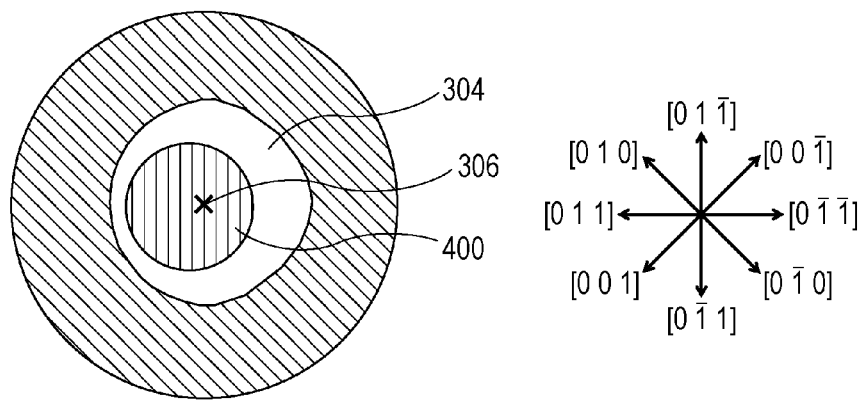
Figure 4C:
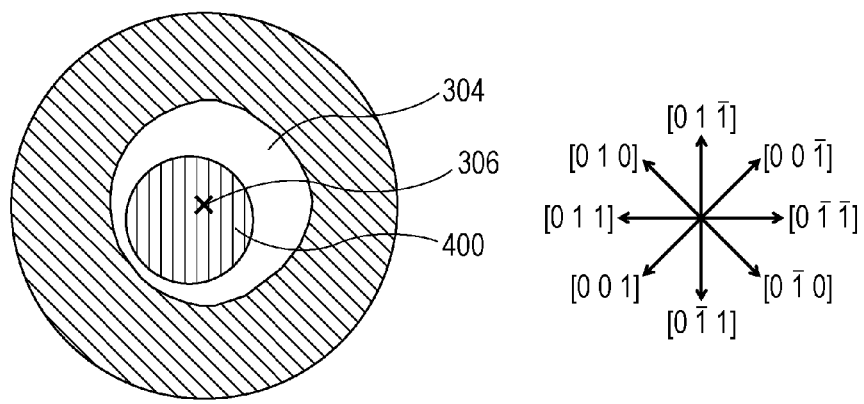

FIGS. 4A to 4C illustrate a surface-relief structure formed in a light-emitting aperture of the surface emitting laser that includes a current injection region 304 that has a distorted circular shape. Note that, in FIGS. 4A to 4C, only a high-reflectivity region 400 of the surface-relief structure is shown; a low-reflectivity region is omitted.

The surface emitting lasers shown in FIGS. 4A to 4C were formed as follows:

FIG. 4A: The surface emitting laser was formed in such a manner that the center of the high-reflectivity region 400 and the center 306 of the mesa structure coincide with each other.

FIG. 4B: The surface emitting laser was formed in such a manner that the center of the high-reflectivity region 400 is located on an axis perpendicular to the (011) plane at a distance of 0.40 µm from the center 306 of the mesa structure.

FIG. 4C: The surface emitting laser was formed in such a manner that the center of the high-reflectivity region 400 is located on an axis perpendicular to the (001) plane at a distance of 0.56 µm from the center 306 of the mesa structure.

Figure 5A:
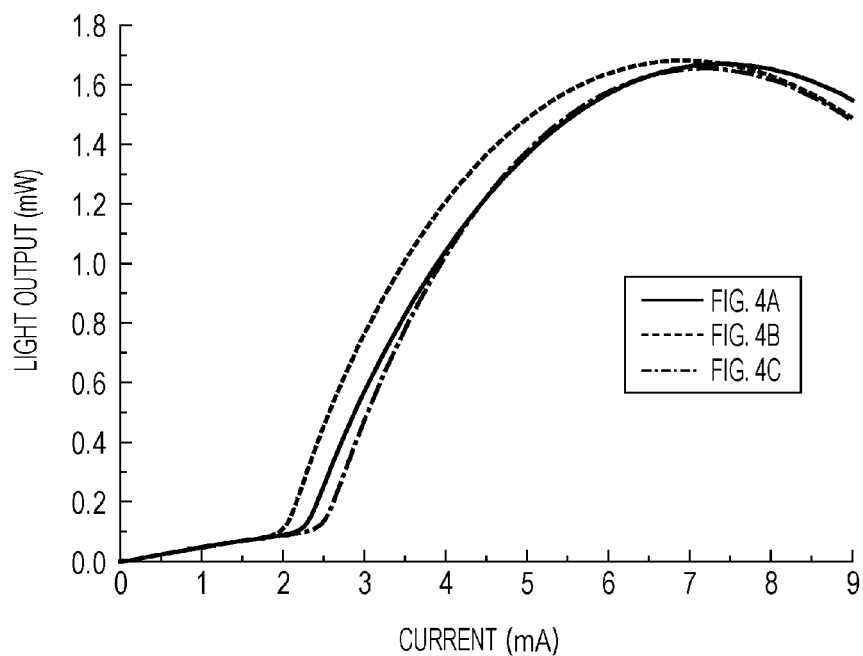
FIGS. 5A and 5B are diagrams illustrating current-light output characteristics of a surface emitting laser of Example 1.

FIG. 5A shows current-light output characteristics of the surface emitting lasers shown in FIGS. 4A to 4C.

Figure 5B:
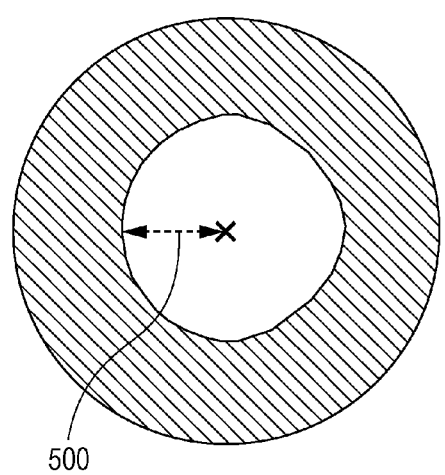

As shown in FIGS. 5A and 5B, the element shown in FIG. 4B has about 10% lower lasing threshold current than the element shown in FIG. 4A. In contrast, the element shown in FIG. 4C has about 10% higher lasing threshold current than the element shown in FIG. 4A.

In Example 1, the distance 500 between the (011) plane-side edge of the current injection region and the center of the mesa structure was 3.2 µm, and the high-reflectivity region had a circular shape with a radius of 2.0 µm.

Since a (100)-oriented GaAs off-orientation substrate inclined at an angle of 10 degrees in the <111>A direction was used in Example 1, the in-plane anisotropy of steam oxidation rate corresponded to a direction in which the (100)-oriented substrate was inclined. Specifically, oxidation rates in the [00-1] and [0-10] directions were higher. As a result, the distorted current injection regions shown in FIGS. 4A to 4C were formed.

Figure 6:
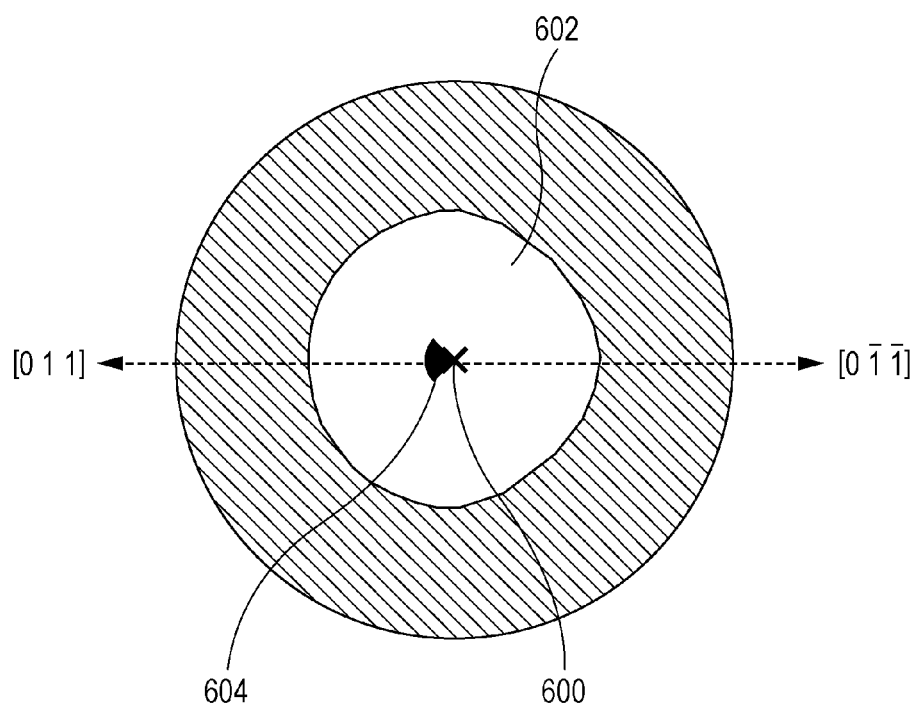
FIG. 6 is a diagram illustrating a region that includes the center of the high-reflectivity region of a surface emitting laser of Example 1.

In such a current injection region, the center of a fundamental transverse mode deviates from the center of the mesa structure toward the [011] direction. Accordingly, as shown in FIG. 6, the center of the high-reflectivity region can lie within a fan-shaped region 604. The fan-shaped region has a central angle of 90 degrees and a radius of r. The arc of the fan-shaped region intersects an axis that passes through the center of the mesa structure and is perpendicular to a plane oriented in the direction in which the off-orientation substrate is inclined. The radius r is less than 15% of the distance between the center 600 of the mesa structure and the periphery of the current injection region (non-oxidized region) 602.

The axis that passes through the center of the mesa structure and is perpendicular to a plane oriented in the direction in which the off-orientation substrate is inclined can be the bisector of the central angle of the fan-shaped region.

The central angle of the fan-shaped region is preferably set to 45 degrees or less, and more preferably set to 30 degrees or less.

Furthermore, the center of the high-reflectivity region can be located on the axis that passes through the center of the mesa structure and is perpendicular to the (011) plane. In this case, the lasing threshold current is effectively lowered. Alternatively, the center of the high-reflectivity region may be located on an axis that passes through the center of the mesa structure and is perpendicular to the (0-1-1) plane.

The distance between the center of the high-reflectivity region and the center of the mesa structure is preferably 15% or less of the distance 500 between the (011) plane-side edge of the current injection region and the center of the mesa structure. In order to effectively lower the lasing threshold current, the distance between the two centers is more preferably about 10% to 13% of the distance 500.

In Example 1, the distance 500 between the (011) plane-side edge of the current injection region and the center of the mesa structure was 3.2 µm, and the distance between the two centers was 0.4 µm, that is, 12.5% of the distance 500.

In Example 1, an off-orientation substrate inclined at an angle of 10 degrees in the <111>A direction was used. However, the different angle may be suitably chosen. Alternatively, for example, an off-orientation substrate inclined at an angle of 2 to 15 degrees may be used.

Fabricating Method

A fabricating method for the surface emitting laser of Example 1 will now be described.

FIGS. 7A to 12C are diagrams for explaining the fabricating method for the surface emitting laser of Example 1.

Figure 7A:
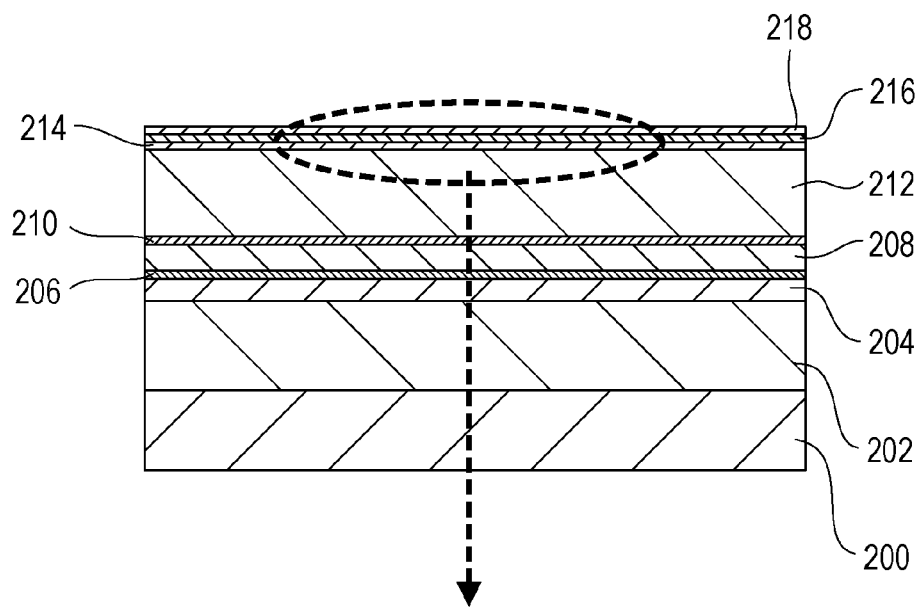
FIGS. 7A and 7B are diagrams for explaining a fabricating method for a surface emitting laser of Example 1.

As shown in FIG. 7A, an n-type AlAs/Al$_{0.5}$Ga$_{0.5}$As multilayer film (bottom reflection mirror) 202 was grown on a (100)-oriented n-type GaAs off-orientation substrate 200 inclined at an angle of 10 degrees in the <111>A direction via a buffer layer (not shown) by using an MOCVD crystal growth technique.

An n-type AlGaInP spacer layer 204 and a GaInP/AlGaInP-MQW active layer 206 were sequentially grown on the bottom reflection mirror 202.

A p-type AlGaInP spacer layer 208 and a p-type Al$_{0.98}$Ga$_{0.02}$As selective-oxidation layer 210 were grown on the active layer 206.

A p-type Al$_{0.9}$Ga$_{0.1}$As/Al$_{0.5}$Ga$_{0.5}$As multilayer film 212 was grown on the selective-oxidation layer 210.

A p-type AlGaInP etch stop layer 214, a p-type Al$_{0.5}$Ga$_{0.5}$As layer 216, and a p-type GaAs contact layer 218 were sequentially grown. Here, the layers from the p-type multilayer film 212 to the p-type GaAs contact layer 218 constitute a top reflection mirror.

Figure 7B:
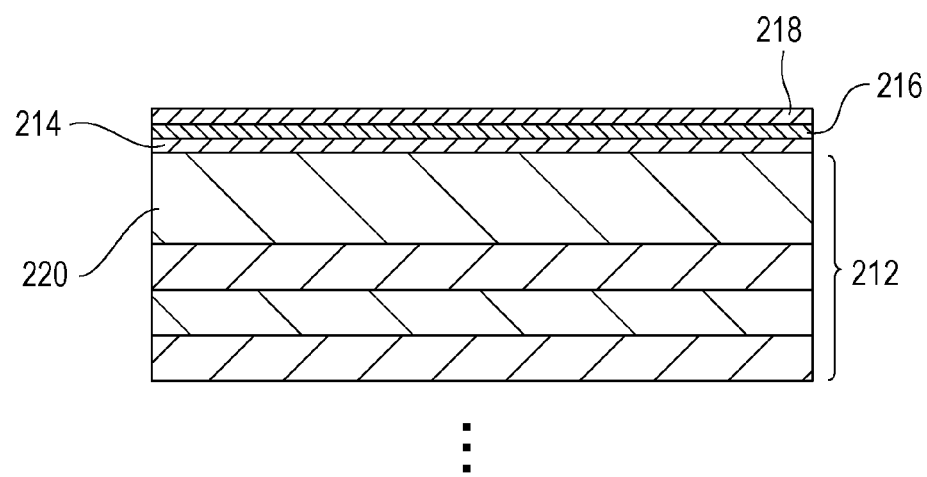

FIG. 7B illustrates the layer structure of the surface-relief structure. The surface-relief structure is constituted by a p-type Al$_{0.5}$Ga$_{0.5}$As layer 220 that has a thickness equal to N multiples of half a wavelength in terms of optical thickness, where N is a natural number of 1 or more, the p-type AlGaInP etch stop layer 214, the p-type Al$_{0.5}$Ga$_{0.5}$As layer 216, and the p-type GaAs contact layer 218.

In order to obtain single transverse mode operation with the utmost efficiency, the total layer thickness of the three layers, namely, the p-type AlGaInP etch stop layer 214, p-type Al$_{0.5}$Ga$_{0.5}$As layer 216, and p-type GaAs contact layer 218, can be equal to an odd multiple of a quarter of the wavelength in terms of optical thickness.

For example, the thickness of the p-type AlGaInP etch stop layer 214 was set to be 10 nm, the thickness of the p-type GaAs contact layer 218 was set to be 20 nm, and the thickness of the p-type Al$_{0.5}$Ga$_{0.5}$As layer 216 was set adequately so that the total layer thickness of the three layers is equal to an odd multiple of a quarter of the wavelength in terms of optical thickness as described above.

In this manner, a plurality of semiconductor layers that includes a bottom reflection mirror, an active layer, a selective-oxidation layer (current confinement layer), a top reflection mirror, and a contact layer were sequentially grown on the substrate.

Figure 8A:
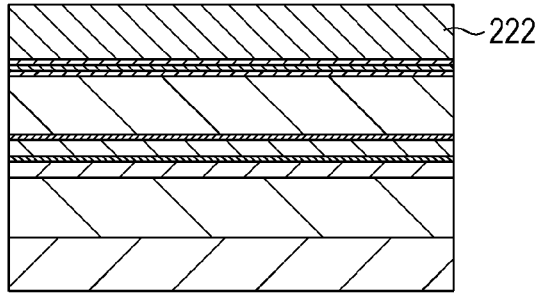
FIGS. 8A to 8D are diagrams for explaining a fabricating method for a surface emitting laser of Example 1.

Then, as shown in FIG. 8A, a first dielectric film 222 was formed on the stacked semiconductor layers. Examples of a material for the first dielectric film 222 include silicon oxide, silicon nitride, and silicon oxynitride.

Figure 8B:
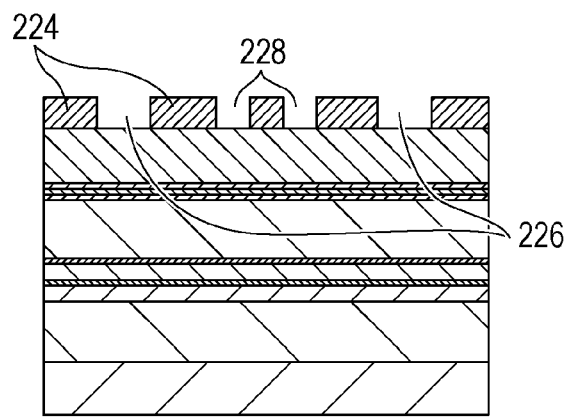
Figure 13A:
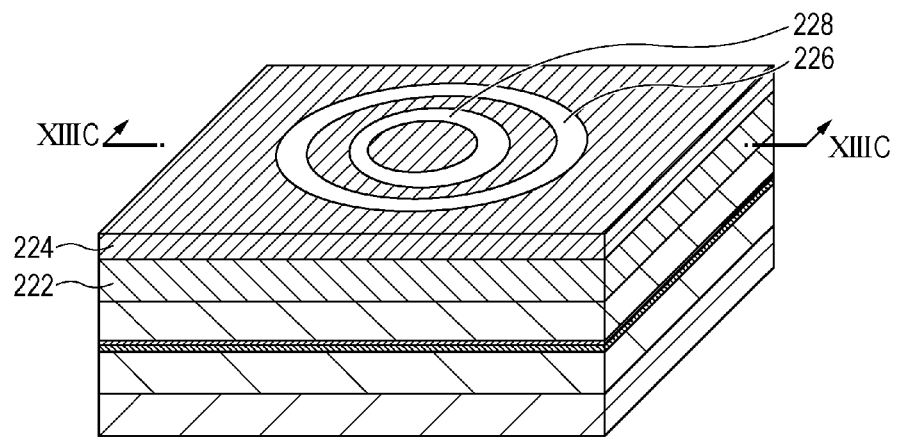
FIGS. 13A to 13C are schematic diagrams illustrating a first resist film formed by a fabricating method for a surface emitting laser of Example 1.
Figure 13B:
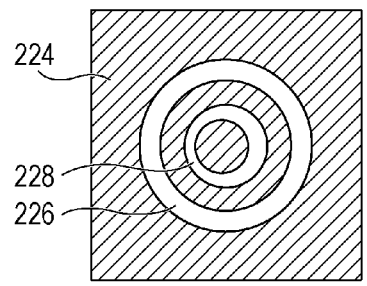
Figure 13C:
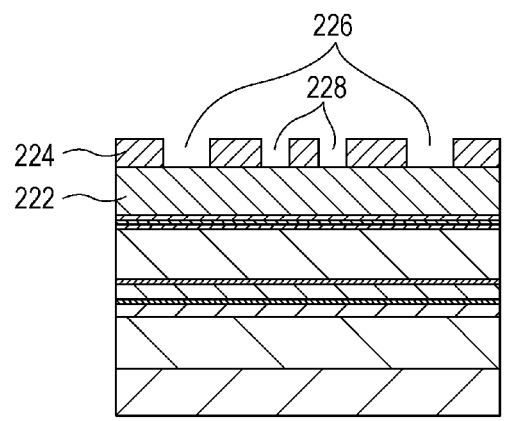

Next, a first resist film 224 was formed on the first dielectric film 222 by lithography (FIG. 8B). FIGS. 13A to 13C illustrate schematic diagrams of the first resist film 224 formed as described above. FIGS. 13A and 13B are a perspective view and a plan view of the surface emitting laser, respectively. FIG. 13C is a cross-sectional view of the surface emitting laser taken along line XIIIC-XIIIC in FIG. 13A.

As will be understood by referring to FIGS. 13A to 13C, large and small ring-shaped patterns that have different central axes from each other, namely, a first pattern 226 and a second pattern 228, are formed in the first resist film 224 so that the first dielectric film 222 is exposed through the first pattern 226 and the second pattern 228. The ring-shaped pattern with the smaller diameter, namely, the second pattern 228, defines the surface-relief structure, that is, stepped structure. The ring-shaped pattern with the larger diameter, namely, the first pattern 226, defines the diameter of the mesa structure. Thus, in the surface emitting laser, in the case where both patterns have different central axes, the center of the mesa structure and the center of the surface-relief structure do not coincide with each other.

In Example 1, the center of the second pattern 228 was located on an axis that is perpendicular to the (011) plane and passes the center of the first pattern 226, and the distance between the two centers was 0.4 μm. However, the center of the second pattern 228 is not necessarily located on the axis that is perpendicular to the (011) plane and passes the center of the first pattern 226. Alternatively, the center of the second pattern 228 may be located so that the center of the high-reflectivity region is located within the fan-shaped region as described above.

Moreover, although ring-shaped patterns with large and small diameters are used in the structure shown in FIGS. 13A to 13C, the smaller ring-shaped pattern may be substituted by, for example, a square-ring-shaped pattern.

In this fabricating step, the first and second patterns are formed on the first dielectric film 222 by lithography collectively. In other words, the relative positions of the first and second patterns are defined. This results in formation of a structure with high precision.

Figure 8C:
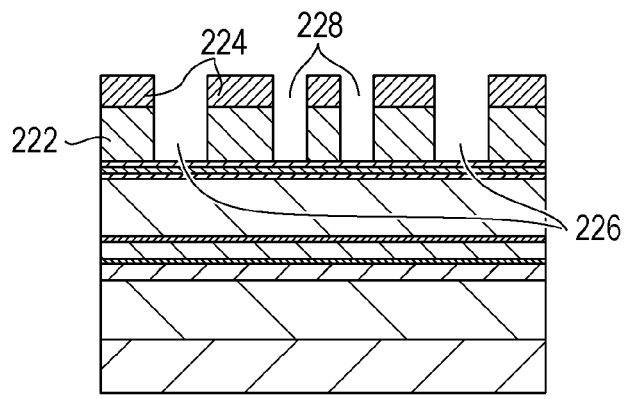

Next, as shown in FIG. 8C, the first resist film 224 was wet-etched using buffered hydrofluoric acid (BHF) so as to transfer the first pattern 226 and the second pattern 228 to the first dielectric film 222. In this step, the first pattern 226 and the second pattern 228, which are large and small ring-shaped opening patterns with different central axes from each other, were formed in the first dielectric film 222.

The method of the pattern transfer is not limited to wet etching but may be dry etching.

After performing the wet etching using buffered hydrofluoric acid, the first resist film 224 was removed.

Figure 8D:
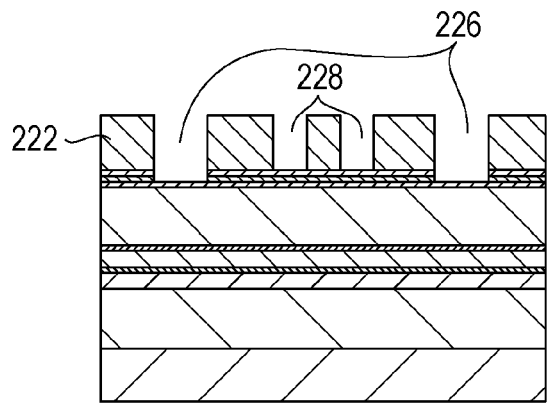

Next, as shown in FIG. 8D, the first and second patterns were formed in the surface of the semiconductor layer using the first dielectric film 222, in which the first pattern 226 and the second pattern 228 had been formed, as a mask and a first etch stop layer 214 of the top reflection mirror. The first etch stop layer may be composed of AlGaInP, GaInP, or the like.

In Example 1, the first etch stop layer 214 was, for example, a p-type AlGaInP etch stop layer with a thickness of 10 nm. The p-type AlGaInP etch stop layer was composed of, for example, $(Al_xGa)In_yP$, where x is 0.5 and y is 0.5.

The patterns were then transferred to both the p-type GaAs contact layer 218 and the p-type $Al_{0.5}Ga_{0.5}As$ layer 216 by wet etching. In this step, a phosphoric acid-based etchant with which an etching rate of the etch stop layer is 10 times or more as low as that of the p-type GaAs contact layer 218 and p-type $Al_{0.5}Ga_{0.5}As$ layer 216, that is, a phosphoric acid-based etchant with a selectivity of 10 or more, was used.

Although wet etching is preferable in consideration of surface damage, the patterns may be transferred by dry etching, alternatively.

Figure 9A:
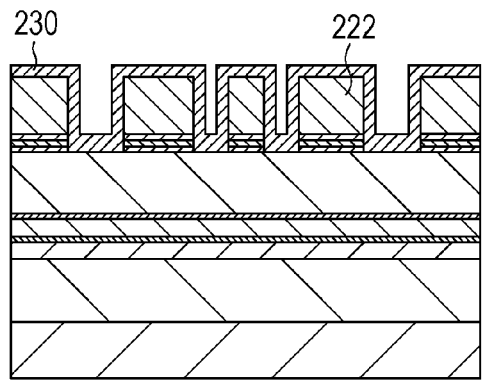
FIGS. 9A to 9D are diagrams for explaining a fabricating method for a surface emitting laser of Example 1.

Next, as shown in FIG. 9A, a second dielectric film 230 was formed by CVD so as to cover the first dielectric film 222.

Figure 10A:
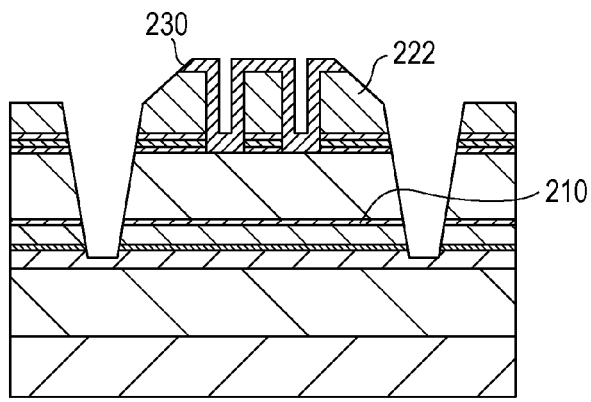
FIGS. 10A to 10D are diagrams for explaining a fabricating method for a surface emitting laser of Example 1.

The second dielectric film 230 is provided to protect the surface-relief structure and has a thickness of, for example, 230 nm. Examples of the second dielectric film 230 include a silicon oxide film, a silicon nitride film, and a silicon oxynitride film. As described above, in Example 1, the surface-relief structure was protected by the second dielectric film 230. This reduces the amount of damage to the surface of the surface-relief structure when oxygen plasma ashing is performed to remove the resist in a following step (FIG. 10A).

In this step, the second dielectric film 230 was formed so as to cover the first pattern 226 formed in the first dielectric film 222. Consequently, the shape of the patterns defined by photolithography was deformed. However, since being formed by, for example, plasma CVD method, the second dielectric film 230 was formed on the sidewall of the first pattern 226 formed in the first dielectric film 222 with a uniform thickness. As a result, although the width of the first pattern 226 that defines the mesa structure became smaller, the second dielectric film 230 with a uniform thickness was isotropically formed. Therefore, the deformed patterns seldom pose a problem in the dry etching for formation of the mesa structure in a following step (FIG. 9D).

Figure 9B:
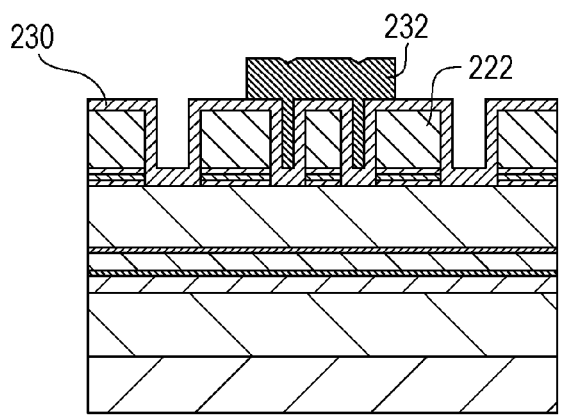

Next, as shown in FIG. 9B, a second resist film 232 was formed by lithography. In this step, the second resist film 232 was formed so as to cover the second pattern 228 that includes the second dielectric film 230.

Figure 9C:
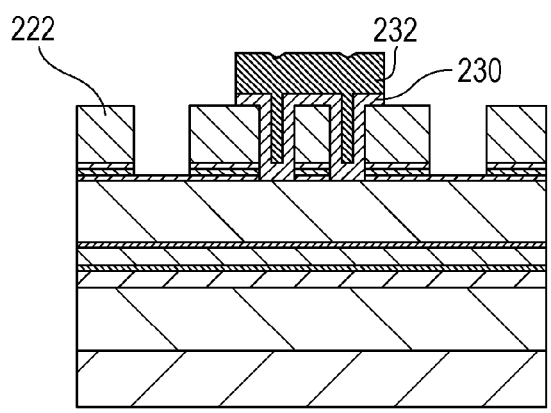
Figure 9D:
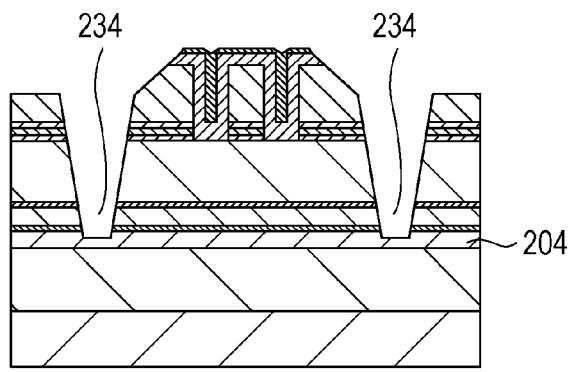

Next, as shown in FIG. 9C, a portion of the second dielectric film 230 was removed by wet etching with buffered hydrofluoric acid using the second resist film 232 as a mask.

The second dielectric film 230 can be formed so as to have a smaller thickness than the first dielectric film 222, because the second dielectric film 230 is provided to protect the surface-relief structure. If the second dielectric film 230 has a large thickness, a long etching time for removing the portion of the second dielectric film 230 is needed, which causes the amount of side etching of the first dielectric film 222 to increase, which may cause deviation from the originally designed values.

Next, as shown in FIG. 9D, a trench 234 was formed by dry etching so that the n-type AlGaInP spacer layer 204 is exposed in the trench 234. Thus, a post of the mesa structure was fabricated.

The second resist film 232 can be formed so as to remain after the dry etching. If the resist has been entirely removed, the second dielectric film 230 is disadvantageously removed during the dry etching, which may cause damage to the surface-relief structure formed in a previous step.

As shown in FIG. 9D, the dry etching was performed until the n-type AlGaInP spacer layer 204 was exposed. However, the dry etching is performed until the sidewall of the p-type $Al_{0.98}Ga_{0.02}As$ selective-oxidation layer 210 that forms the current confinement layer is entirely exposed and not necessarily performed until the n-type AlGaInP spacer layer 204 is exposed.

Next, as shown in FIG. 10A, the second resist film 232 was removed by oxygen plasma ashing. In this step, since the surface-relief structure is protected by the second dielectric film 230, damage to the surface of the surface-relief structure can be prevented.

Figure 10B:
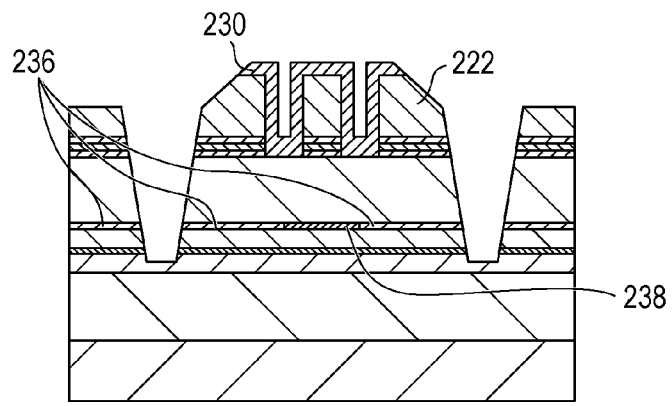

Next, as shown in FIG. 10B, the p-type $Al_{0.98}Ga_{0.02}As$ selective-oxidation layer 210 was selectively oxidized in steam, for example, at a substrate temperature of 450° C. to form the current confinement layer, which includes an oxidized region 236 and a non-oxidized region 238.

In this step, since the surface of the semiconductor layer is covered with the first dielectric film 222 or the second dielectric film 230, the surface of the stacked semiconductor layer is also protected from the oxidation process. Therefore, in a following step (FIG. 11C), electrodes with a low contact resistance may be formed.

Next, the removal of the second dielectric film 230 and the removal of the first etch stop layer 214 along the second pattern were performed in the same step using the semiconductor layer immediately below the first etch stop layer as a second etch stop layer.

Figure 10C:
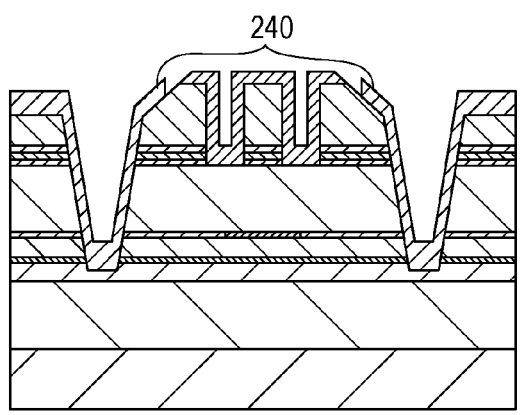

Specifically, as shown in FIG. 10C, a third resist film 240 was formed so that the first dielectric film 222 and the second dielectric film 230 in the upper portion of the mesa structure were exposed through the third resist film 240.

Figure 10D:
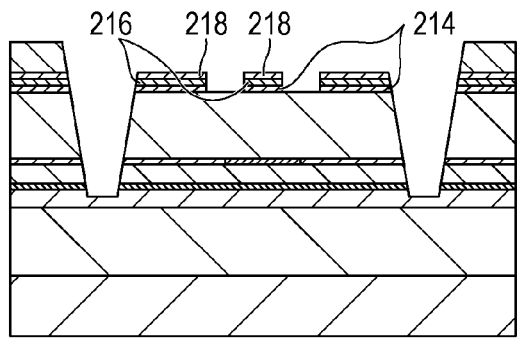

Then, as shown in FIG. 10D, the second dielectric film 230 that included the first dielectric film 222 was removed by wet etching. At the same time, the first etch stop layer 214 was removed along the second pattern, and the patterns were transferred to the first etch stop layer 214.

Figure 14A:
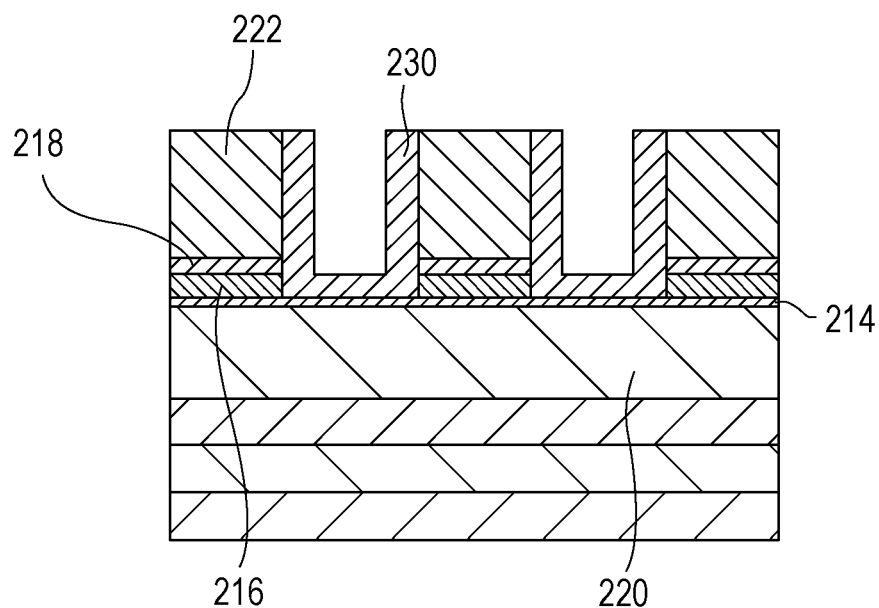
FIGS. 14A and 14B are schematic diagrams illustrating a surface-relief structure formed by a fabricating method for a surface emitting laser of Example 1.
Figure 14B:
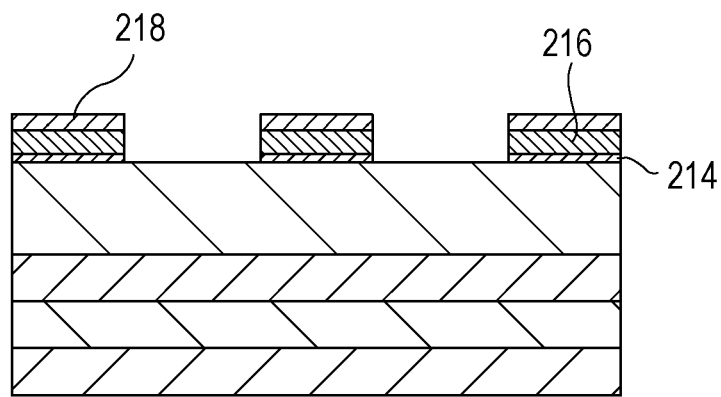

FIGS. 14A and 14B illustrate the surface-relief structures before and after the wet etching, respectively. In this step, as shown in FIGS. 14A and 14B, the patterns were transferred using three layers, namely, the first dielectric film 222, the p-type GaAs contact layer 218, and the p-type $Al_{0.5}Ga_{0.5}As$ layer 216, as masks in the following manner.

Specifically, the above three layers were used as masks, and the p-type $Al_{0.5}Ga_{0.5}As$ layer 220 was utilized as an etch stop layer (second etch stop layer). The patterns were then transferred to the p-type AlGaInP etch stop layer (first etch stop layer) 214 using the second etch stop layer.

The second etch stop layer may be composed of AlGaAs, for example, that contains 75% or less Al.

To transfer the patterns to the above-described first etch stop layer 214, the p-type GaAs contact layer 218 immediately below the first dielectric film 222 may be used as an etch stop layer (third etch stop layer). This third etch stop layer is of the same conductivity type as the above-described first and second etch stop layers.

In this step, buffered hydrofluoric acid that contains hydrofluoric acid and ammonium fluoride was used as the etchant. With this etchant, an etching rate of the p-type $Al_{0.5}Ga_{0.5}As$ layer 220 is 10 times or more lower than that of the p-type AlGaInP etch stop layer 214. That is, the etchant has a selectivity of 10 or more.

In this step, the p-type AlGaInP etch stop layer 214 was etched in addition to the p-type GaAs contact layer 218 and the p-type $Al_{0.5}Ga_{0.5}As$ layer 216. Thus, a surface-relief structure was formed.

Figure 11A:
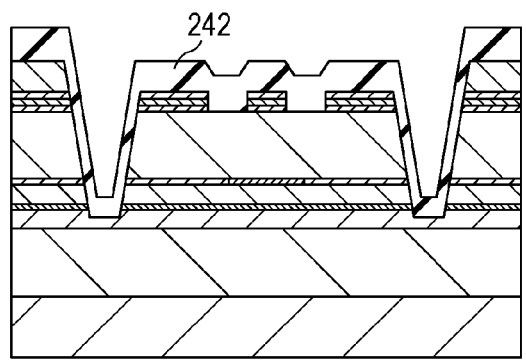
FIGS. 11A to 11D are diagrams for explaining a fabricating method for a surface emitting laser of Example 1.

Next, as shown in FIG. 11A, an insulating film 242 was formed by CVD so as to cover the entirety of the element. Examples of a material for the insulating film 242 include silicon oxide, silicon nitride, and silicon oxynitride.

The reflectivities of the high-reflectivity region and the low-reflectivity region, which are formed as components of the surface-relief structure, do not vary when the thickness d of the insulating film 242 satisfies the following relationship:

$$d=(N\lambda)/(2n_d)$$

where $\lambda$ is the oscillation wavelength, $n_d$ is the refractive index of the second dielectric film, and N is a natural number of 1 or more.

Figure 11B:
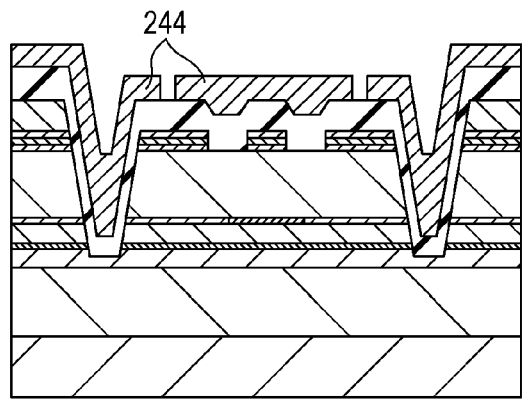

Next, as shown in FIG. 11B, a fourth resist film 244 was formed by lithography.

Figure 11C:
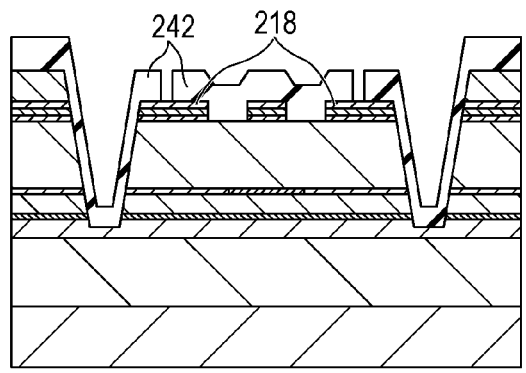

Subsequently, as shown in FIG. 11C, the insulating film 242 was removed by wet etching with buffered hydrofluoric acid, and a portion of the contact layer 218 was exposed.

Figure 11D:
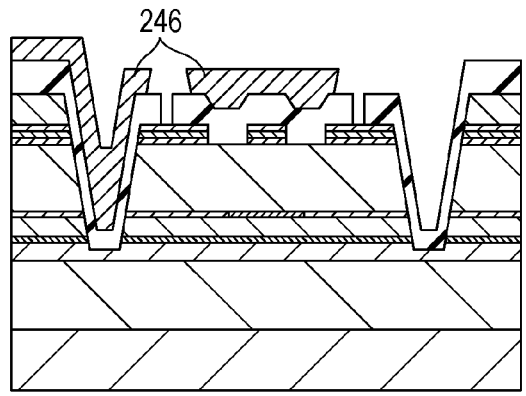

In the step shown in FIG. 11D, a fifth resist film 246 was formed so as to cover a light-emitting aperture so that the contact layer was exposed through the fifth resist film 246.

Figure 12A:
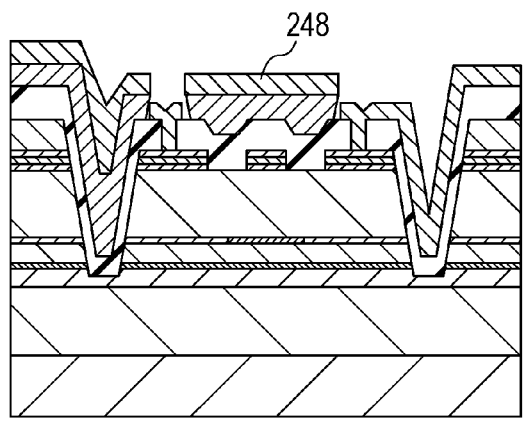
FIGS. 12A to 12C are diagrams for explaining a fabricating method for a surface emitting laser of Example 1.

In the step shown in FIG. 12A, a metal film 248 composed of Ti/Au was deposited on the surface of the surface emitting laser by using a metal vapor deposition technique.

Figure 12B:
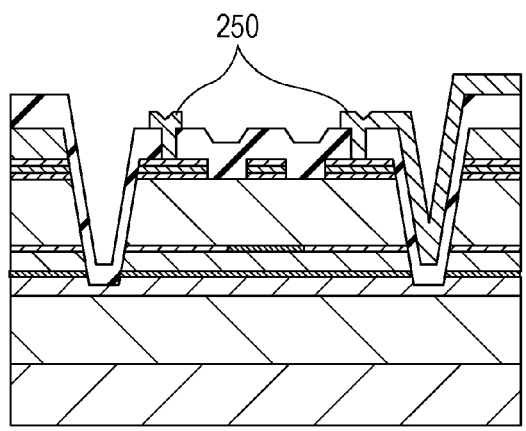

In the step shown in FIG. 12B, a pad electrode 250 was formed by using a lift-off technique so as not to cover the light-emitting aperture.

Figure 12C:
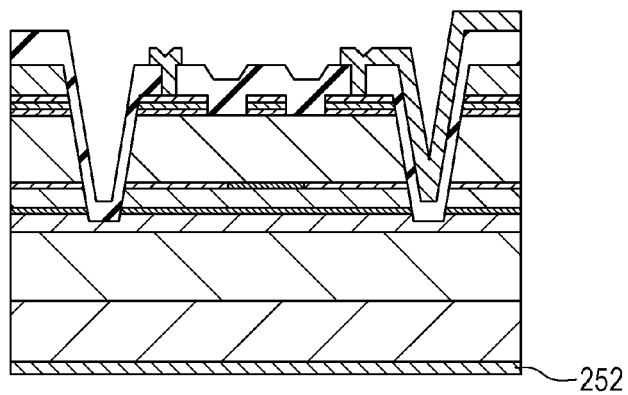

In the step shown in FIG. 12C, an n-type side electrode (AuGe/Ni/Au) 252 was formed on the backside of the n-type GaAs substrate by using a metal vapor deposition technique.

In Example 1, the etch stop layer was the p-type AlGaInP layer. However, the etch stop layer may be a p-type GaInP layer.

In Example 1, a layer structure that forms the surface-relief structure was a three-layer structure, but is not limited to this. For example, the layer structure may be a combination of the two layers such as the etch stop layer and the contact layer, as long as the total thickness of the layers that constitute the surface-relief structure is equal to an odd multiple of a quarter of the wavelength in terms of optical thickness.

In Example 1, a 680-nm-band surface emitting laser was mentioned, but the surface emitting laser is not limited to this and applicable also to, for example, a 850-nm-band (GaAs/AlGaAs active layer-based) surface emitting laser.

The method or apparatus for fabricating a surface emitting laser is not limited to the MOCVD crystal growth technique, lithography, and method or apparatus used for etching, ashing, and vapor deposition, which are shown in Example 1. Any method or apparatus having a similar function can be employed instead.

The fabricating method of Example 1 is applicable to an array that includes a plurality of the single-element surface emitting lasers.

Example 2

In Example 2, a surface emitting laser that has a concave surface-relief structure formed in a light-emitting region will be described.

Figure 15A:
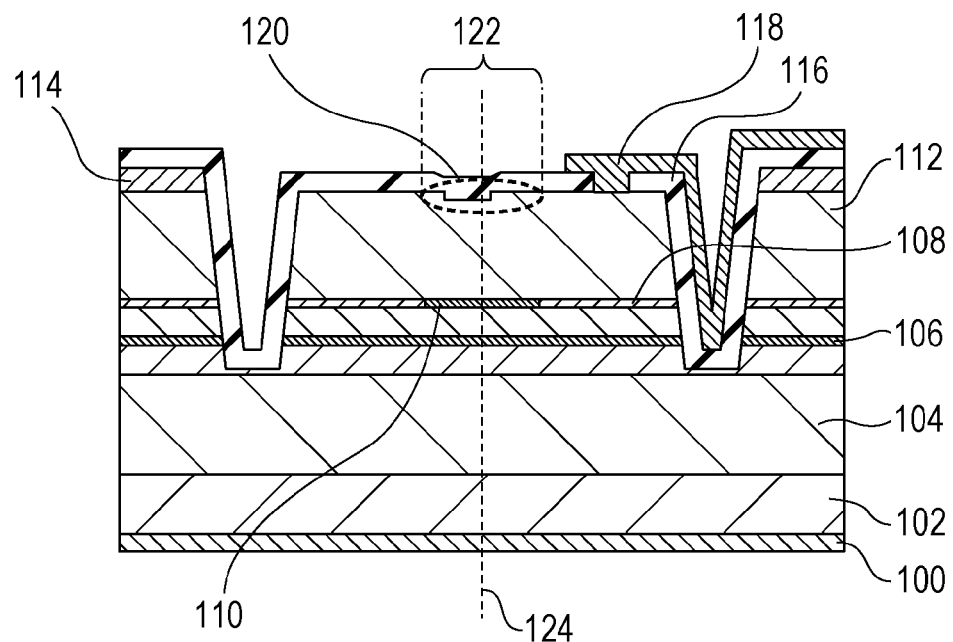
FIGS. 15A and 15B are schematic diagrams illustrating a structure of a surface emitting laser of Example 2.
Figure 15B:
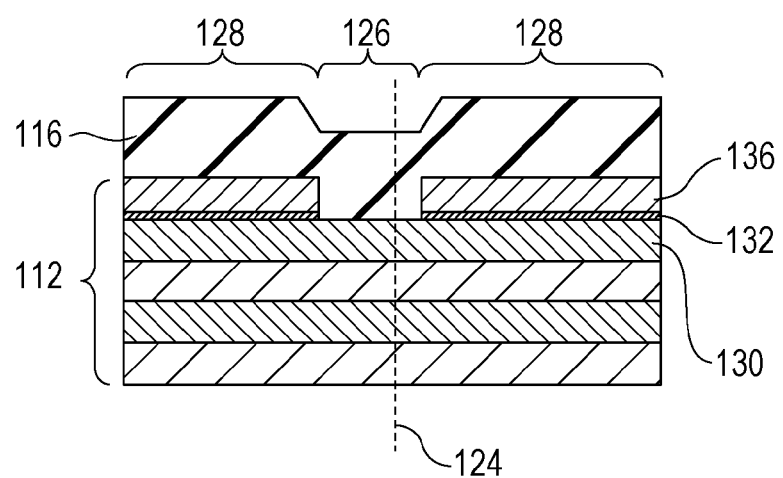

FIGS. 15A and 15B are schematic diagrams for explaining the surface emitting laser of Example 2. FIG. 15A is a schematic cross-sectional view for explaining the light-emitting region 122. FIG. 15B is an enlarged view of the light-emitting region 122.

In FIGS. 15A and 15B, components the same as those of Example 1 illustrated in FIGS. 1 and 2 are given the same reference numerals.

Example 2 differs from Example 1 in that the low-reflectivity region 128 has a convex shape and the high-reflectivity region 126 has a concave surface-relief structure in Example 2, while the high-reflectivity region 126 has a convex shape in Example 1. A fabricating method for the surface emitting laser of Example 2 will now be described.

As shown in FIG. 15B, the p-type AlGaInP etch stop layer 132 and the p-type GaAs contact layer 136 were formed on the surface of the top reflection mirror 112 composed of p-type $Al_{0.9}Ga_{0.1}As/Al_{0.5}Ga_{0.5}As$. In addition, the shape of the second pattern formed in the first resist film is different from that of Example 1. The other steps are the same as in Example 1.

Figure 16A:
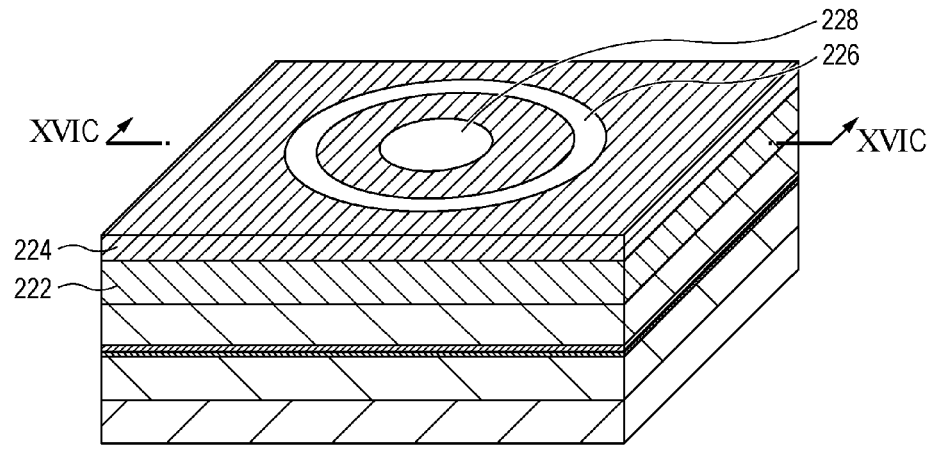
FIGS. 16A to 16C are schematic diagrams illustrating a first resist film formed by a fabricating method for a surface emitting laser of Example 2.
Figure 16B:
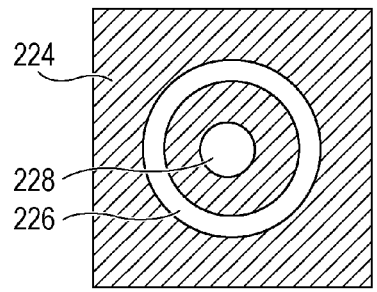
Figure 16C:
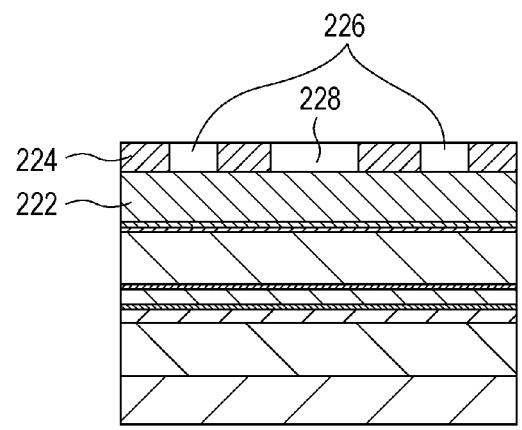

FIGS. 16A to 16C illustrate schematic diagrams of the first resist film of Example 2 for explaining the difference from the first resist film of Example 1 shown in FIGS. 13A to 13C. FIGS. 16A and 16B are a perspective view and a plan view of the surface emitting laser, respectively. FIG. 16C is a cross-sectional view of the surface emitting laser taken along line XVIC-XVIC in FIG. 16A.

In FIGS. 16A to 16C, the reference numerals 222, 224, 226, and 228 denote the first dielectric film, first resist film, first pattern, and second pattern, respectively.

As shown in FIGS. 16A to 16C, large ring-shaped pattern and small circular pattern that have different central axes from each other, namely, the first pattern 226 and the second pattern 228, are formed in the first resist film 224 so that the first dielectric film 222 is exposed through the first pattern 226 and the second pattern 228. The first pattern 226 defines the mesa structure. The second pattern 228 defines the surface-relief structure.

Example 3

Figure 17A:
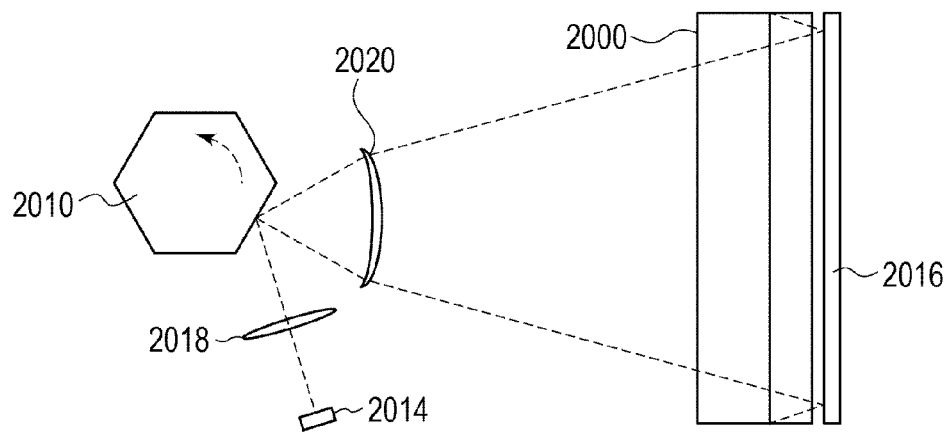
FIGS. 17A and 17B are schematic diagrams for explaining an electrophotographic image forming apparatus that includes a laser array formed by a fabricating method for a surface emitting laser of Example 3.
Figure 17B:
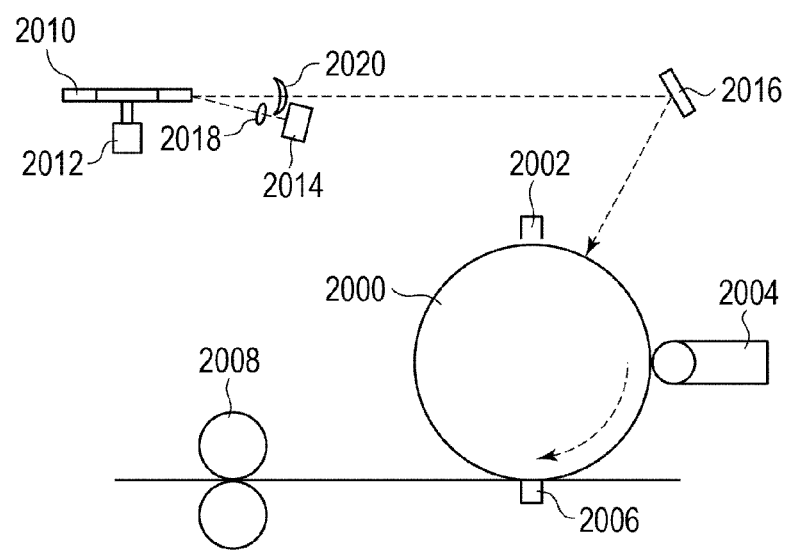

Referring to FIGS. 17A and 17B, an image forming apparatus that includes a surface emitting laser array light source including a plurality of the above-described surface emitting lasers will be described. FIGS. 17A and 17B are a plan view and a side view of the image forming apparatus, respectively.

A laser beam emitted by a surface emitting laser array light source 2014, which is used as a recording light source, passes through a collimator lens 2018 and impinges on a rotatable polygonal mirror 2010 rotated by a motor 2012. The laser beam impinging on the rotatable polygonal mirror 2010 is then reflected by the rotatable polygonal mirror 2010 and becomes a deflected beam that has an emission angle that continuously varies depending on the rotation of the rotatable polygonal mirror 2010. The reflected laser beam passes through an f-θ lens 2020 in order to correct the distortion, is reflected by a reflector 2016, and impinges on a photoconductor 2000. The photoconductor 2000 has been charged by a charger 2002 in advance, and is sequentially exposed to light during laser beam scanning. Thus, an electrostatic latent image is formed. The electrostatic latent image formed on the photoconductor 2000 is then developed by a developer 2004. The developed visible image is transferred to a transfer paper by a transfer charger 2006. The transfer paper to which the visible image is transferred is conveyed to a fixing device 2008. The visible image is fixed on the transfer paper and then the transferred paper is ejected outside the image forming apparatus.

The surface emitting laser array light source is also applicable to other optical and medical devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-017092 filed Jan. 30, 2012, which is hereby incorporated by reference herein in its entirety.

What is claimed is:

1. A surface emitting laser comprising:
   an off-orientation substrate;
   a bottom reflection mirror formed on the off-orientation substrate;
   an active layer formed on the bottom reflection mirror;
   a current confinement layer formed on the active layer, the current confinement layer including an oxidized region and a non-oxidized region;
   a top reflection mirror formed on the current confinement layer;
   a mesa structure having a cylindrical shape; and
   a surface-relief structure formed on a light-emitting region of the top reflection mirror, the surface-relief structure has a stepped structure including a low-reflectivity region and a high-reflectivity region,
   wherein a central axis of the high-reflectivity region of the surface-relief structure is deviated from a central axis of the cylindrical shape of the mesa structure so as to lower a lasing threshold current of the surface emitting laser.

2. The surface emitting laser according to claim 1, wherein the center of the high-reflectivity region of the surface-relief structure is located corresponding to a direction in which the off-orientation substrate is inclined.

3. The surface emitting laser according to claim 1, wherein the center of the high-reflectivity region of the surface-relief structure lies within a fan-shaped region having a central angle of 90 degrees or less and a radius r,
   an arc of the fan-shaped region intersects an axis that passes through a center of the mesa structure, the axis being perpendicular to a plane oriented in a direction in which the off-orientation substrate is inclined, and
   the radius r is 15% or less of a distance between the center of the mesa structure and a periphery of the non-oxidized region.

4. The surface emitting laser according to claim 3, wherein the axis that passes through the center of the mesa structure and is perpendicular to the plane oriented in the direction in which the off-orientation substrate is inclined is a bisector of the central angle.

5. The surface emitting laser according to claim 3, wherein the central angle of the fan-shaped region is 45 degrees or less.

6. The surface emitting laser according to claim 1, wherein the center of the high-reflectivity region of the surface-relief structure is located on an axis that passes through a center of the mesa structure, the axis being perpendicular to a plane oriented in a direction in which the off-orientation substrate is inclined.

7. The surface emitting laser according to claim 1, wherein the off-orientation substrate is a (100)-oriented GaAs off-orientation substrate inclined at an angle of 2 to 15 degrees in the <111>A direction.

8. The surface emitting laser according to claim 7, wherein the center of the high-reflectivity region of the surface-relief structure is located on an axis that passes through a center of the mesa structure, the axis being perpendicular to the (011) plane.

9. The surface emitting laser according to claim 7, wherein the center of the high-reflectivity region of the surface-relief structure is located on an axis that passes through a center of the mesa structure, the axis being perpendicular to the (0-1-1) plane.

10. The surface emitting laser according to claim 7, wherein, in a cross-section parallel to the off-orientation substrate, the non-oxidized region has a circular shape distorted in the <111>A direction.

11. The surface emitting laser according to claim 7, wherein a central axis of the high-reflectivity region of the surface-relief structure is deviated from the central axis of the cylindrical shape of the mesa structure at least in a direction of a (011) plane.

12. The surface emitting laser according to claim 1, wherein, in a cross-section parallel to the off-orientation substrate, the non-oxidized region has a distorted circular shape.

13. The surface emitting laser according to claim 1, wherein, in a cross-section parallel to the off-orientation substrate, the high-reflectivity region of the surface-relief structure has a circular shape.

14. A surface emitting laser array comprising a plurality of the surface emitting lasers according to claim 1.

15. An image forming apparatus comprising:
   a surface emitting laser array that includes a plurality of the surface emitting lasers according to claim 1;
   a photoconductor that forms an electrostatic latent image with light emitted by the surface emitting laser array;
   a charger that charges the photoconductor; and
   a developer that develops the electrostatic latent image.

16. An image forming apparatus comprising:
   the surface emitting laser according to claim 1; and
   a photoconductor that forms an electrostatic latent image with light emitted by the surface emitting laser.

17. A surface emitting laser comprising:
   an off-orientation substrate;
   a bottom reflection mirror formed on the off-orientation substrate;
   an active layer formed on the bottom reflection mirror;

a current confinement layer formed on the active layer, the current confinement layer including an oxidized region and a non-oxidized region;

a top reflection mirror formed on the current confinement layer; and a surface-relief structure formed on a light-emitting region of the top reflection mirror, the surface-relief structure has a stepped structure including a low-reflectivity region and a high-reflectivity region, wherein a central axis of the high-reflectivity region of the surface-relief structure is deviated from a center of the mesa structure, and is located so as to be closer to a center of a fundamental transverse mode.

18. The surface emitting laser according to claim 17, wherein the center of the high-reflectivity region of the surface-relief structure lies within a fan-shaped region having a central angle of 90 degrees or less and a radius r, an arc of the fan-shaped region intersects an axis that passes through the center of the mesa structure, the axis being perpendicular to a plane oriented in a direction in which the off-orientation substrate is inclined, and the radius r is 15% or less of a distance between the center of the mesa structure and a periphery of the non-oxidized region.

19. A surface emitting laser comprising:

an off-orientation substrate;

a bottom reflection mirror formed on the off-orientation substrate;

an active layer formed on the bottom reflection mirror;

a current confinement layer formed on the active layer, the current confinement layer including an oxidized region and a non-oxidized region;

a top reflection mirror formed on the current confinement layer; and a surface-relief structure formed on a light-emitting region of the top reflection mirror, the surface-relief structure has a stepped structure including a low-reflectivity region and a high-reflectivity region, wherein the off-orientation substrate is a (100)-oriented GaAs off-orientation substrate inclined at an angle of 2 to 15 degrees in the <111>A direction, and wherein a central axis of the high-reflectivity region of the surface-relief structure is deviated from the center of the mesa structure at least in a direction of a (011) plane.

20. The surface emitting laser according to claim 19, wherein the center of the high-reflectivity region of the surface-relief structure lies within a fan-shaped region having a central angle of 90 degrees or less and a radius r, an arc of the fan-shaped region intersects an axis that passes through the center of the mesa structure, the axis being perpendicular to a plane oriented in a direction in which the off-orientation substrate is inclined, and the radius r is 15% or less of a distance between the center of the mesa structure and a periphery of the non-oxidized region.

\* \* \* \* \*